(12) United States Patent
Yasseri et al.

(10) Patent No.: US 12,064,795 B2
(45) Date of Patent: Aug. 20, 2024

(54) CONDITIONING CHAMBER COMPONENT

(71) Applicant: Lam Research Corporation, Fremont, CA (US)

(72) Inventors: Amir A. Yasseri, San Jose, CA (US); Hong Shih, Santa Clara, CA (US); John Daugherty, Fremont, CA (US); Duane Outka, Fremont, CA (US); Lin Xu, Fremont, CA (US); Armen Avoyan, Glendale, CA (US); Cliff La Croix, Gardnerville, NV (US); Girish Hundi, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 687 days.

(21) Appl. No.: 17/211,518

(22) Filed: Mar. 24, 2021

(65) Prior Publication Data

US 2021/0205858 A1    Jul. 8, 2021

Related U.S. Application Data

(62) Division of application No. 15/969,626, filed on May 2, 2018, now Pat. No. 10,967,407.

(Continued)

(51) Int. Cl.
*B08B 7/04* (2006.01)
*B08B 3/04* (2006.01)
(Continued)

(52) U.S. Cl.
CPC ............ *B08B 7/04* (2013.01); *B08B 3/048* (2013.01); *B08B 3/12* (2013.01); *B08B 3/14* (2013.01); *B08B 5/02* (2013.01); *H01J 37/32853* (2013.01)

(58) Field of Classification Search
CPC .. B08B 7/04; B08B 3/048; B08B 3/12; B08B 3/14; B08B 5/02; H01J 37/32853
(Continued)

(56) References Cited

U.S. PATENT DOCUMENTS 6,220,259 B1    4/2001    Brown et al.
6,539,952 B2    4/2003    Itzkowitz
(Continued)

FOREIGN PATENT DOCUMENTS

CN    2338805 Y    9/1999
CN    1735467      2/2006
(Continued)

OTHER PUBLICATIONS

Korean Office Action dated Nov. 23, 2022 from Korean Application No. 10-2018-0049545.
(Continued)

*Primary Examiner* — Tinsae B Ayalew
(74) *Attorney, Agent, or Firm* — Beyer Law Group LLP

(57) ABSTRACT

A method for conditioning a component of a wafer processing chamber is provided. The component is placed in an ultrasonic conditioning solution in an ultrasonic solution tank. Ultrasonic energy is applied through the ultrasonic conditioning solution to the component to clean the component. The component is submerged in a megasonic conditioning solution in a tank. Megasonic energy is applied through the megasonic conditioning solution to the component to clean the component.

11 Claims, 11 Drawing Sheets

Related U.S. Application Data

(60) Provisional application No. 62/500,688, filed on May 3, 2017.

(51) Int. Cl.
  *B08B 3/12* (2006.01)
  *B08B 3/14* (2006.01)
  *B08B 5/02* (2006.01)
  *H01J 37/32* (2006.01)

(58) Field of Classification Search
  USPC .......................................................... 134/184
  See application file for complete search history.

(56) References Cited

U.S. PATENT DOCUMENTS

| | | | |
|---|---|---|---|
| 7,033,068 | B2 | 4/2006 | Ching et al. |
| 8,152,928 | B2 | 4/2012 | Watanabe et al. |
| 8,327,861 | B2 | 12/2012 | Yin et al. |
| 2001/0032657 | A1* | 10/2001 | Itzkowitz ................. B08B 3/12 134/198 |
| 2003/0000547 | A1* | 1/2003 | Carpenter ............. B08B 7/0014 134/4 |
| 2005/0145271 | A1 | 7/2005 | Dickinson |
| 2006/0213615 | A1 | 9/2006 | Rastegar |
| 2007/0267040 | A1* | 11/2007 | Watanabe ......... H01L 21/67057 134/1 |
| 2011/0041871 | A1 | 2/2011 | Fan |
| 2012/0080051 | A1* | 4/2012 | Beck ........................ C11D 3/06 134/1 |
| 2013/0056041 | A1 | 3/2013 | Yin et al. |
| 2015/0099431 | A1* | 4/2015 | Hong ..................... B01D 29/52 451/447 |
| 2018/0318890 | A1 | 11/2018 | Yasseri et al. |

FOREIGN PATENT DOCUMENTS

| | | |
|---|---|---|
| CN | 105195465 | 7/2017 |
| JP | H02-137321 | 5/1990 |
| JP | H11-347503 | 12/1999 |
| JP | 2005-203769 | 7/2005 |
| KR | 10-2007-0111973 | 11/2007 |
| KR | 10-2009-0101242 | 9/2009 |
| WO | WO2002009161 A2 * | 1/2002 |

OTHER PUBLICATIONS

Office Action from U.S. Appl. No. 15/969,626 dated Mar. 20, 2020.
Final Office Action from U.S. Appl. No. 15/969,626 dated Oct. 1, 2020.
Wang, Ailing et al., "Power Ultrasonic Vibration Processing Technology", National Defense Industry Press, pp. 260-261.
Li, Zidong et al., "Practical Adhesive Technology", National Defense Industry Press, p. 29.
Chinese Office Action from Chinese Application No. 201810413115.1 dated Sep. 7, 2021.
Korean Office Action from Korean Application No. 10-2018-0049545 dated May 22, 2023.

* cited by examiner

CONDITIONING CHAMBER COMPONENT

CROSS REFERENCE TO RELATED APPLICATION

This application is a divisional of U.S. application Ser. No. 15/969,626 dated May 2, 2018, which claims the benefit of priority of U.S. Provisional Application No. 62/500,688 dated May 3, 2017, which is incorporated herein by reference for all purposes.

BACKGROUND

The disclosure relates to a method for conditioning a ceramic component. More specifically, the disclosure relates to a method for conditioning a ceramic component for use in a wafer plasma processing chamber.

In forming semiconductor devices wafer plasma processing chambers are used to process substrates. Some plasma processing chambers have ceramic containing components, such as dielectric power windows, gas injectors, edge rings, electrodes, showerheads, high flow liners, and electrostatic chucks.

SUMMARY

To achieve the foregoing and in accordance with the purpose of the present disclosure, an apparatus for conditioning a component of a processing chamber is provided. A tank holds a megasonic conditioning solution. A mount holds the component immersed in the megasonic conditioning solution, when the tank is filled with the megasonic conditioning solution. A megasonic conditioning solution inlet system delivers the megasonic conditioning solution to the tank. A megasonic transducer head comprises at least one megasonic transducer to provide megasonic energy to the megasonic conditioning solution, wherein the megasonic energy is delivered to the component via the megasonic conditioning solution. A megasonic conditioning solution drain system drains the megasonic conditioning solution from the tank at a location above where the component is held in the megasonic conditioning solution. An actuator moves the megasonic transducer head across the tank above where the component is held in the megasonic conditioning solution.

In another manifestation, a method for conditioning a component of a wafer processing chamber is provided. The component is placed in an ultrasonic conditioning solution in an ultrasonic solution tank. Ultrasonic energy is applied through the ultrasonic conditioning solution to the component to clean the component. The component is submerged in a megasonic conditioning solution in a tank. Megasonic energy is applied through the megasonic conditioning solution to the component to clean the component.

In another manifestation, an apparatus for conditioning a component of a processing chamber is provided. A tank holds a megasonic conditioning solution. A mount holds the component immersed in the megasonic conditioning solution, when the tank is filled with the megasonic conditioning solution. A megasonic conditioning solution inlet system delivers the megasonic conditioning solution to the tank. A megasonic transducer head comprising at least one stationary megasonic transducer is placed in the tank, to provide megasonic energy to the megasonic conditioning solution, wherein the megasonic energy is delivered to the component via the megasonic conditioning solution. A megasonic conditioning solution drain system drains the megasonic conditioning solution from the tank at a location above where the component is held in the megasonic conditioning solution.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
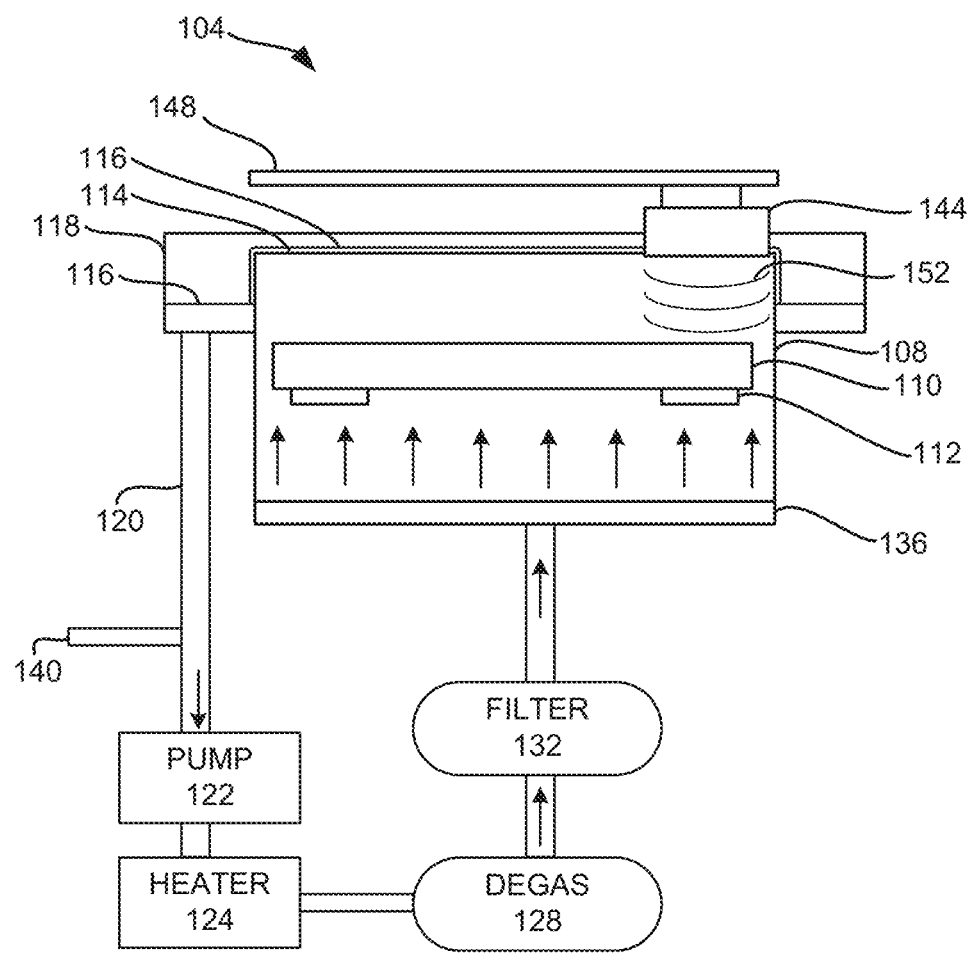
FIG. 1A is a side schematic view of a megasonic processing module used in an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Semiconductor fabrication equipment process modules including etch, strip, clean, and depositions tools use critical chamber hardware components fabricated to various shapes, sizes, and geometries that are made from poly-crystalline ceramic materials such as alumina and/or alumina with zirconia and yttria based coatings. These materials when fabricated into components can often be loaded with numerous sources of surface contaminants including organic residues, inorganic metallic/ionic impurities, and particles that manifest themselves as loosely-bound solids that vary in morphology and sizes ranging from hundreds of microns to submicron down to tens of nanometers. These particles are highly undesirable and either can load on to the material during component fabrication machining processes for example (grinding, lapping, polishing) or sometimes are also inherently built into the bulk top-layer surface morphology as a byproduct of the coating process. Submicron and nano-sized particle loading on any etch, deposition, or clean module component prior to or upon installation must be avoided to ensure that process qualification and particle monitoring generally being measured down to 28 nm is successful. Otherwise, unclean components will inevitably lead to numerous defect issues on the wafer upon initial startup of a process module. This causes adverse and unwanted impact on the startup time, product yield, and overall productivity.

With these challenges in mind, ceramic surfaces of newly fabricated critical chamber components must be cleaned with higher precision using a robust cleaning method that not only targets removal of larger micron sized particles but also eliminates all undesirable small sized particles below 30-800 nanometers. There are known ways to remove micron sized particles using traditional means, such as blasting, wiping, soaking in organic solvents, aqueous based surfactants, inorganic acid mixtures, alkaline mixes, pressure rinsing, and sonication for component cleaning. For example, ceramic component manufacturing suppliers and components cleaning suppliers servicing plasma etch and deposition process tooling customers rely on conventional wet chemical cleaning (detergents for degreasing, highly concentrated inorganic acids such as nitric acid, hydrofluoric acid, phosphoric acid, and sulfuric acid for metal contaminant removal. Variations of surfactants followed by final deionized water rinses using ultrasonic equipment operated in a frequency range from 40 kHz to a few hundred kHz are used to clean components. It is known that these methods that target contamination and particle removal drop in efficiency as particle diameter size approaches submicron to nanometers. Although these traditional component cleaning approaches have been engineered to handle components of various shapes, sizes, and geometries, they lack the ability to effectively remove nanometer to submicron sized particles from ceramic surfaces of finished components. This gap has led to numerous out of the box quality issues for newly manufactured components that were installed in chambers and have been found to yield high particle defects upon module startups. The work around thus far has been to extend in chamber pre-seasoning times to bring particle levels down to expected specifications. Such practices are highly undesirable and negatively impact chamber productivity. Furthermore, the main problem with seasoning the plasma chamber to obtain reproducible low particle steady state process conditions is that such conditioning time, supplies, and resources, add cost and complexity that negatively impacts productivity. Accordingly, it would be desirable for incoming components to exhibit superior particle cleanliness down to submicron to nanometers via a rough preconditioning and final precision clean treatment method that is done prior to chamber installations, Such a method would be more economical and productive.

An embodiment provides a method and apparatus for conditioning and precision cleaning surfaces of a ceramic component having alumina, and/or alumina coated with other ceramic materials such as zirconia, yttria or combinations thereof. In some cases the ceramic component may also have bare aluminum surfaces and/or anodized aluminum surfaces exposed. However, there may be cases where chamber components may also have alternate materials used. Such materials are commonly used to construct components intended for plasma etch or deposition process chamber modules in which semiconductor substrates such as silicon wafers are processed. To name a few examples, these can include an electrostatic chuck (ESC) ceramic plate, a transformer coupled plasma (TCP) ceramic coated window, a ceramic gas injector, numerous types of deposition showerheads, and/or other ceramic coated anodized aluminum components. Hence, these new critical components made from alumina and other ceramic based materials require a precision cleaning method that is extremely robust to effectively eliminate all undesirable organic and inorganic contaminates including all submicron down to nanometer sized particles. Particulates can build up over time while a new component is being fabricated from repetitive material deposition such as one in a spray process that coats the component where undesired contaminates can deposit over the bulk layer morphology. Alternatively, particulates can also originate from any successive steps used to achieve a desired surface finish, such as by grinding, lapping, and polishing processes. If not cleaned, submicron and nanometer sized particles loading on any etch, deposition, or clean module component may inevitably lead to numerous defect issues on the wafer upon initial startup of a process module, thereby causing adverse and unwanted impact on the startup time, product yield, and overall productivity.

FIG. 1A is a schematic cross-sectional side view of a megasonic processing module 104 used in an embodiment. In this example, the megasonic processing module 104 comprises a tank 108 in which the ceramic containing component 110, which is a power window, is placed. The ceramic containing component 110 is supported by a component mount 112, which may be a basket for holding the ceramic containing component 110. The tank 108 has at least one weir 114, which forms a low point in the tank, which acts as a spillway. In this embodiment, the entire top of the tank 108 is a low point and thus forms the weir 114. A megasonic conditioning solution 116 fills the tank 108 to the top of the weir 114. The megasonic conditioning solution 116 flows over the weir 114 into a gutter 118 mounted to the side of the tank 108. The gutter 118 catches the megasonic conditioning solution 116, which spills over the weir 114. A gutter drain 120 drains the megasonic conditioning solution 116 from the gutter 118, through a pump 122. The spillway formed by the at least one weir 114, the gutter 118, and the gutter drain 120 form a megasonic conditioning solution drain system. A heater 124 is in fluid connection with the gutter drain 120 and pump 122. A degas unit 128, comprising a degas membrane, is in fluid connection between the heater 124 and a filter 132. The filter 132 is in fluid connection between the degas unit 128 and a megasonic conditioning solution inlet system 136. The gutter drain 120 is in fluid connection with a discharge duct 140. A scanning megasonic transducer head 144 is positioned above the tank 108. The scanning megasonic transducer head 144 is attached to an actuator 148 for moving the megasonic transducer head 144 across the tank 108 above the ceramic containing component. The megasonic transducer head 144 may span across one dimension of the tank 108 and travel across another dimension of the tank 108. In this example, the megasonic conditioning solution 116 is an alkaline solution with a pH of at least 8. In this example, the megasonic conditioning solution is dilute ammonium hydroxide and water ($NH_4OH:H_2O$) or ammonium hydroxide, hydrogen peroxide, and water ($NH_4OH:H_2O_2:H_2O$) at a volumetric ratio of (1:1:5), which is called an SC1 solution.

Figure 1B:
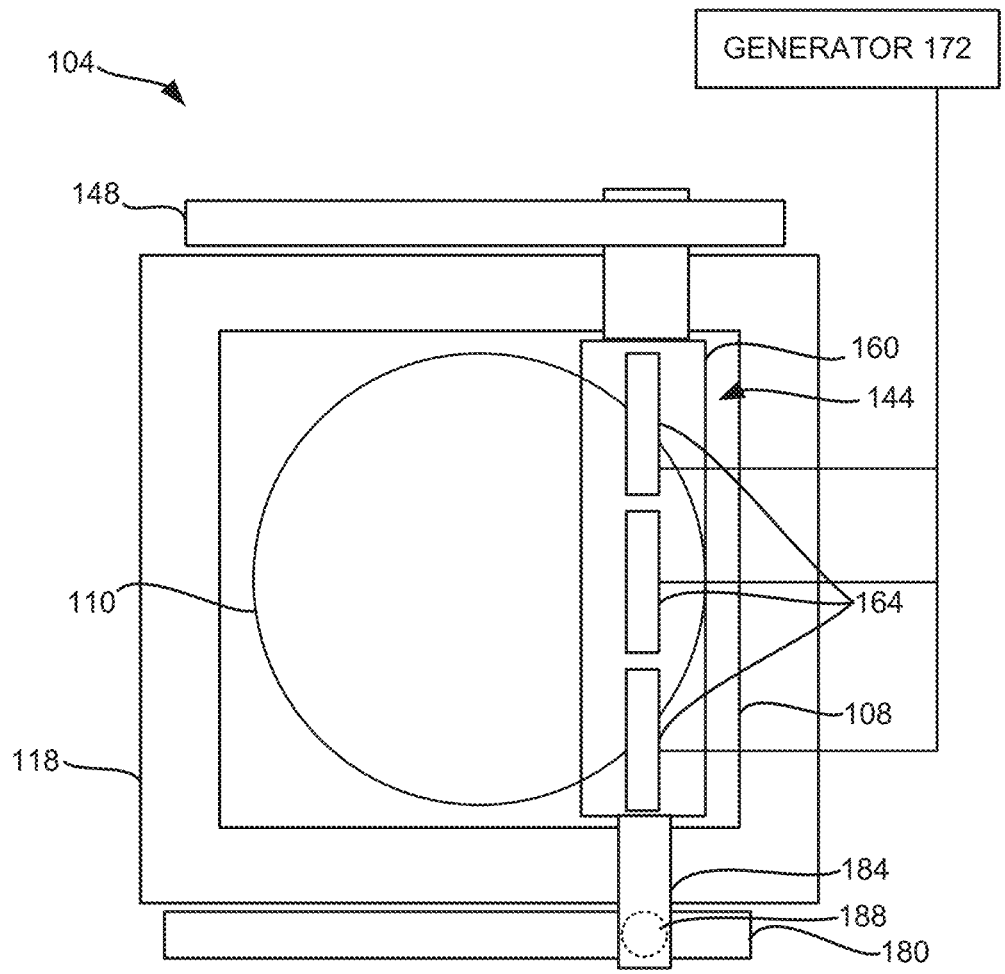
FIG. 1B is a top schematic view of the megasonic processing module of FIG. 1A.

FIG. 1B is a schematic top view of the megasonic processing module 104. The megasonic processing module 104 comprises the tank 108 in which the ceramic containing component 110, which is the power window, is placed. The gutter 118 is mounted to the side of the tank 108. The scanning megasonic transducer head 144 is positioned above the tank 108. The scanning megasonic transducer head 144 comprises a housing 160 of quartz enclosing a plurality of megasonic transducers 164 placed along the length of the scanning megasonic transducer head 144. The actuator 148 moves the megasonic transducer head 144 across the tank 108 substantially perpendicular to the length of the scanning megasonic transducer head 144. The sides of the tank 108 are nonmetallic, such as plastic, so that the sides do not interact with the megasonic conditioning solution 116. Each megasonic transducer 164 is connected to at least one generator 172, where the at least one generator provides enough power to the megasonic transducer head 144, so that the megasonic transducer head 144 provides at least 2 Watts/cm$^2$ of power.

Figure 1C:
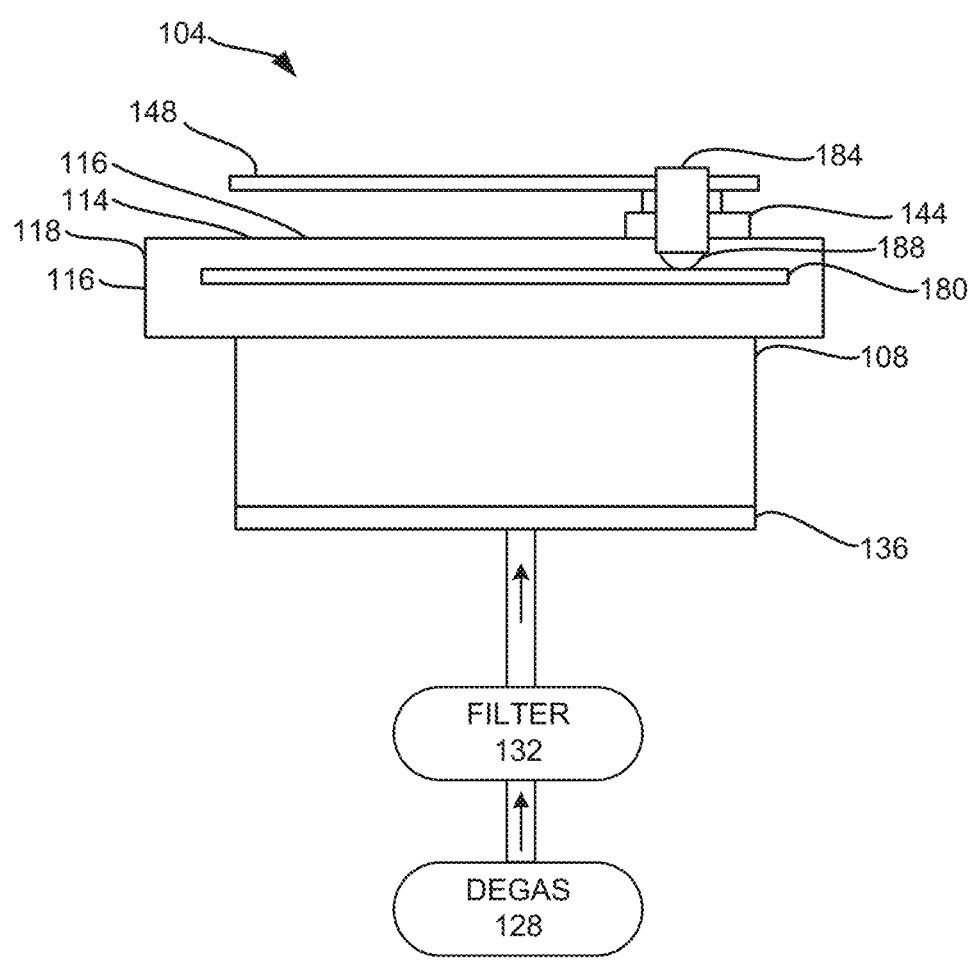
FIG. 1C is a side schematic view of the megasonic processing module of FIG. 1A, viewed from the opposite side of FIG. 1A.

FIG. 1C is a schematic side view of the megasonic processing module 104. The megasonic processing module 104 opposite from the cross-sectional side view shown in FIG. 1A. A support track 180 is provided on a side of the tank 108. The scanning megasonic transducer head 144 is supported on a first side of the length of the scanning megasonic transducer head 144 by the actuator 148, as shown in FIG. 1B. The second side of the length of the scanning megasonic transducer head 144 is attached to a socket housing 184. A ball 188 is mounted in the socket housing 184 and rests on the support track 180. The support track 180, socket housing 184, and ball 188 provide support for the second side of the length of the scanning transducer head. The support improves control over the positioning of the scanning megasonic transducer head 144.

Figure 2:
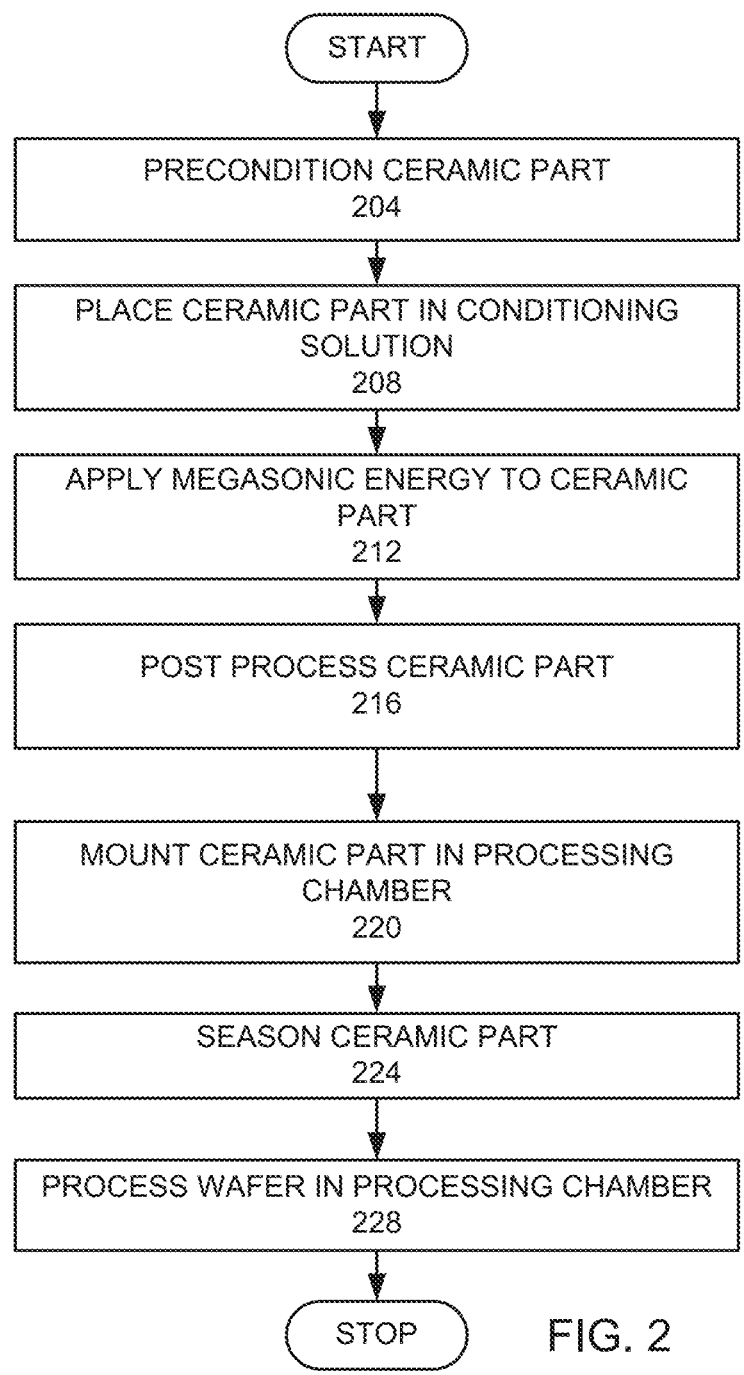
FIG. 2 is a high level flow chart of an embodiment.

FIG. 2 is a high level flow chart of an embodiment for conditioning a component. In this embodiment, a ceramic containing component is preconditioned (step 204). The ceramic containing component is placed in a megasonic conditioning solution (step 208). Megasonic energy is applied through the megasonic conditioning solution to the ceramic containing component (step 212). A post process is provided to the ceramic containing component 110 (step 216). The ceramic containing component 110 is mounted to be part of a wafer processing chamber (step 220). The ceramic containing component is seasoned (step 224). A wafer is processed in the processing chamber (step 228).

Figure 3:
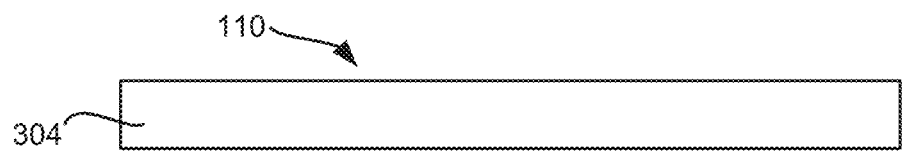
FIG. 3 is an enlarged cross-sectional view of a ceramic containing component process in an embodiment.

In a preferred embodiment, a ceramic containing component is preconditioned (step 204) in a first clean process. FIG. 3 is an enlarged cross-sectional view of a ceramic containing component 110 that is the power window. The power window comprises a ceramic window body 304. The ceramic window body 304 may be of one or more different materials. Preferably, the ceramic window body 304 comprises at least one of silicon (Si), quartz, silicon carbide (SiC), silicon nitride (SiN), aluminum oxide (AlO), aluminum nitride (AlN), or aluminum carbide (AlC). The ceramic window body 304 may have a protective ceramic coating.

Figure 4:
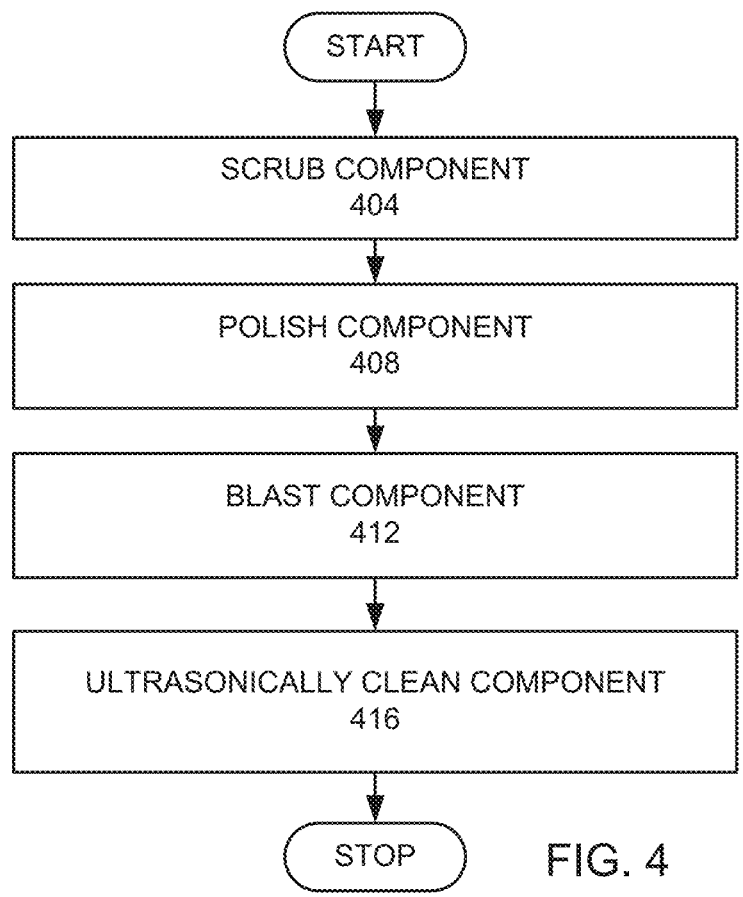
FIG. 4 is a more detailed flow chart of a preconditioning of the ceramic containing component.

The ceramic containing component 110 is preconditioned (step 204). FIG. 4 is a more detailed flow chart of the preconditioning of the ceramic containing component 110 (step 204). The ceramic containing component 110 is scrubbed (step 404). The ceramic containing component 110 is polished (step 408). The ceramic component is blasted (step 412). The ceramic component is ultrasonically cleaned (step 416).

In this embodiment, the scrubbing of the ceramic containing component 110 (step 404) may be by a manual or motorized pad such as a Scotch Brite™ scrub pad made from materials such as aluminum oxide or silicon carbide.

In this embodiment, the polishing of the ceramic containing component 110 (step 408) may be by a manual or motorized polishing pad or plate containing polishing media such as a diamond based slurry, organic based lubricant, silica or alumina paste, or diamond pads.

In this embodiment, the blasting the ceramic containing component 110 (step 412) comprises bombarding surfaces of the ceramic containing component 110 with solid fine particle shavings of dry ice. Dry ice particulates are first fabricated by feeding a hopper at rates between 0.5 to 2 pounds/min. The particulates are blasted towards the surface of interest of the ceramic containing component 110 with clean compressed air with pressures at approximately 25 psi to approximately 75 psi for approximately 30 seconds to approximately 20 minutes. The preconditioning then wipes surfaces of the ceramic containing component 110 to remove residual debris. Afterwards, a pressure rinse removes the dry ice blasted component with deionized water at 20 psi to 40 psi. Excess water is removed by blowing with filtered nitrogen.

In this embodiment, the ultrasonically cleaning the ceramic containing component 110 (step 416) comprises putting the ceramic containing component into an ultrasonic cleaning bath of an ultrasonic conditioning solution in an ultrasonic solution tank. Ultrasonic energy is provided at a frequency between 40 kHz to 200 kHz from 5 minutes to approximately 60 minutes.

The ceramic containing component is placed in a megasonic conditioning solution (step 208). In this example, the ceramic containing component 110 is placed in the tank 108, shown in FIG. 1. Megasonic energy is applied through the megasonic conditioning solution to the ceramic containing component 110 (step 212). Megasonic energy is applied through the megasonic conditioning solution 116 to the ceramic containing component 110. In this example, the megasonic energy 152 is applied by the scanning megasonic transducer head 144 at a frequency of 950 kHz or higher, at a power where the scanning subjects each section of a surface of the ceramic containing component 110 to a power density of approximately 2 to 10 Watts/cm$^2$ for approximately 5 minutes to approximately 60 minutes. In this embodiment, the megasonic conditioning solution 116 pumped into the tank 108 through the megasonic conditioning solution inlet system 136. Megasonic conditioning solution 116 flows into the gutter 118 then to the gutter drain 120 and then the heater 124. The heater 124 heats the megasonic conditioning solution 116. The degas unit 128 removes or reduces bubbles and/or gas in the megasonic conditioning solution 116. The megasonic conditioning solution 116 is then passed to the filter 132 which filters particles from the megasonic conditioning solution 116. The pump 122, heater 124, degas unit 128, and filter 132 may be in different orders in other embodiments. In various embodiments the pump 122, heater 124, degas unit 128, and filter 132 may be in different orders and are in serial fluid connection between the megasonic conditioning solution drain system and the megasonic conditioning solution inlet system.

To this end, the described cleaning sequence has proven to be highly effective in removing especially nanometer to submicron particle residues leftover on the surface of individual grains of the bulk material. Alumina surfaces, which exhibit extremely challenging topography (i.e. within surface pits, on top and in-between surface grains, hills and valleys within a coating morphology), have been proven to be cleaned using an embodiment. The clean also yields equivalent nano-sized particle removal efficiency on smooth low arithmetic mean (Ra) polish finished surfaces of some critical hardware components that are fabricated into various shapes, geometries, and sizes. The clean also removes gross larger micron sized particle contaminates.

Figure 5:
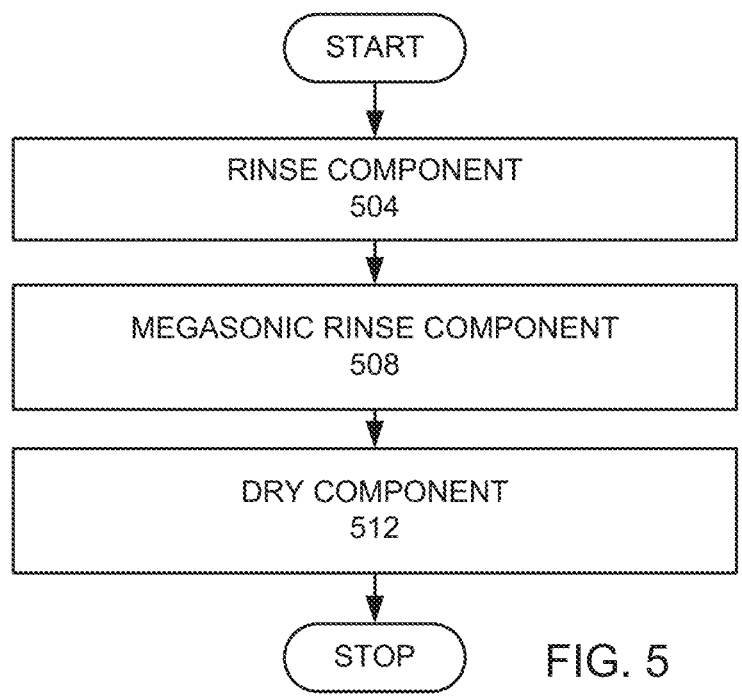
FIG. 5 is a more detailed flow chart of a post process.
Figure 6:
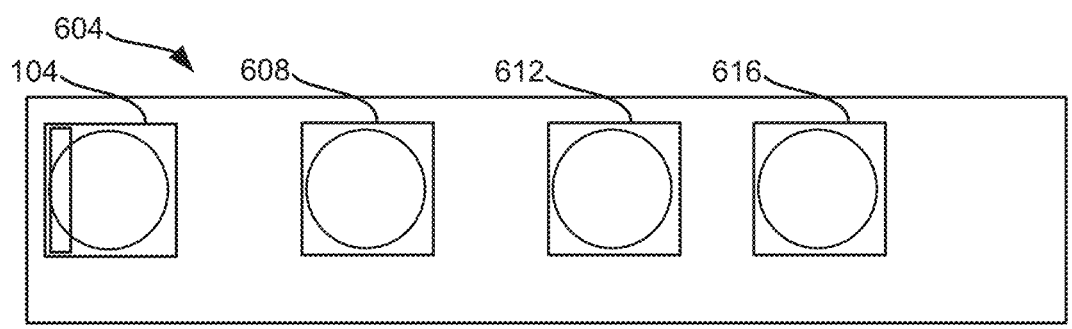
FIG. 6 is a schematic view of a megasonic clean and post process system.

The ceramic containing component 110 is post processed (step 216). FIG. 5 is a more detailed flow chart of the post process (step 216). FIG. 6 is a schematic view of a megasonic clean and post process system 604. The megasonic clean and post process system comprises the megasonic processing module 104, a rinse tank 608, a megasonic rinse tank 612, and a dryer tank 616. After the ceramic containing component 110 is cleaned in the megasonic processing module 104, the ceramic containing component 110 is moved to the rinse tank 608. In this embodiment, the ceramic containing component 110 is sprayed with water to rinse the ceramic containing component 110 (step 504). The ceramic containing component 110 is then moved to the megasonic rinse tank 612. The megasonic rinse tank 612 may be similar to the megasonic processing module 104. The megasonic rinse tank 612 is filled with pure deionized water. The megasonic rinse tank 612 provides megasonic energy through the pure deionized water in order to megasonically rinse the ceramic containing component 110 (step 508). The ceramic containing component 110 is moved to the dryer tank 616. In this embodiment, the dryer tank 616 sprays a filtered heated dry nitrogen gas to dry the ceramic containing component 110 (step 512).

Figure 7:
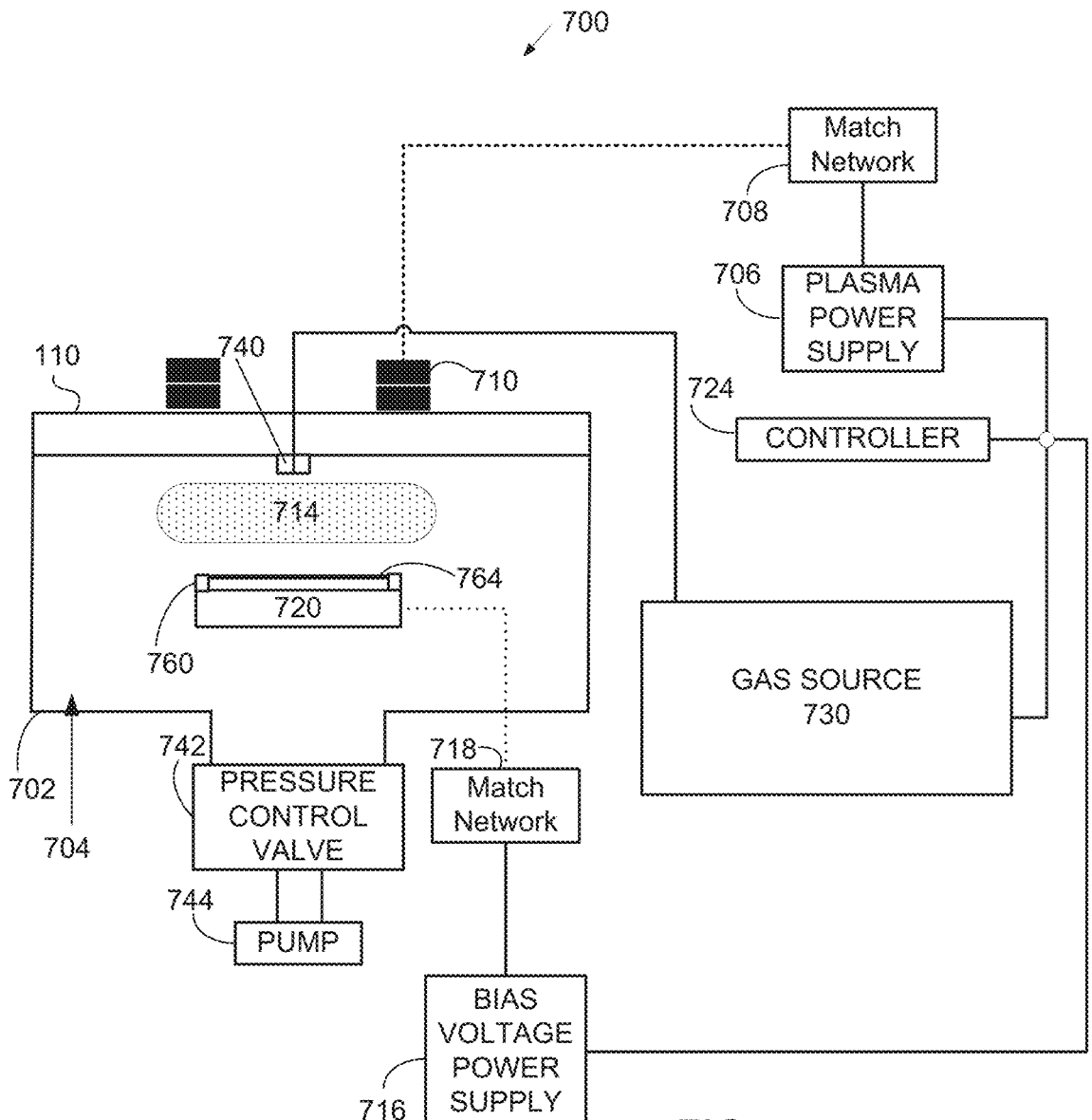
FIG. 7 schematically illustrates an example of a plasma processing chamber, which may be used in an embodiment.

The ceramic containing component 110 is mounted to be part of a processing chamber (step 220). FIG. 7 schematically illustrates an example of a plasma processing chamber 700 which may be used in an embodiment. The plasma processing chamber 700 includes a plasma reactor 702 having a plasma processing confinement chamber 704 therein. A plasma power supply 706, tuned by a match network 708, supplies power to a transformer coupled power (TCP) coil 710. The TCP coil 710 is located near a power window, which is the ceramic containing component 110. A plasma 714 is created in the plasma processing confinement chamber 704 by providing an inductively coupled power. The TCP coil (upper power source) 710 may be configured to produce a uniform diffusion profile within the plasma processing confinement chamber 704. For example, the TCP coil 710 may be configured to generate a toroidal power distribution in the plasma 714. The power window is provided to separate the TCP coil 710 from the plasma processing confinement chamber 704, while allowing energy to pass from the TCP coil 710 to the plasma processing confinement chamber 704. A wafer bias voltage power supply 716 tuned by a match network 718 provides power to an electrode 720 to set the bias voltage on the wafer 764. The wafer 764 is supported by the electrode 720.

The plasma power supply 706 and the wafer bias voltage power supply 716 may be configured to operate at specific radio frequencies such as, for example, 13.56 MHz, 27 MHz, 2 MHz, 60 MHz, 400 kHz, 2.54 GHz, or combinations thereof. Plasma power supply 706 and wafer bias voltage power supply 716 may be appropriately sized to supply a range of powers in order to achieve desired process performance. For example, in one embodiment, the plasma power supply 706 may supply the power in a range of 50 to 5000 Watts, and the wafer bias voltage power supply 716 may supply a bias voltage of in a range of 20 to 2000 V. In addition, the TCP coil 710 and/or the electrode 720 may be comprised of two or more sub-coils or sub-electrodes, which may be powered by a single power supply or powered by multiple power supplies.

As shown in FIG. 7, the plasma processing chamber 700 further includes a gas source/gas supply mechanism 730. The gas source 730 is in fluid connection with plasma processing confinement chamber 704 through a gas inlet, such as a gas injector 740. The gas injector 740 may be located in any advantageous location in the plasma processing confinement chamber 704, and may take any form for injecting gas. Preferably, however, the gas inlet may be configured to produce a "tunable" gas injection profile, which allows independent adjustment of the respective flow of the gases to multiple zones in the plasma processing confinement chamber 704. The process gases and byproducts are removed from the plasma process confinement chamber 704 via a pressure control valve 742 and a pump 744, which also serve to maintain a particular pressure within the plasma processing confinement chamber 704. The pressure control valve 742 can maintain a pressure of less than 2 Torr during processing. An edge ring 760 is placed around the wafer 764. A controller 724 sets points for the plasma power supply 706, gas source/gas supply mechanism 730, and the wafer bias voltage power supply 716. A Kiyo by Lam Research Corp. of Fremont, Calif., may be used to practice an embodiment.

The ceramic containing component 110 is seasoned (step 224). The seasoning of the ceramic containing component 110 involves using the plasma processing confinement chamber 704 without processing wafers. Dummy wafers may be used during processing, but during the seasoning, the dummy wafers are not processed to provide devices on the wafer. After a sufficient number of seasoning cycles, a wafer is processed in the plasma processing confinement chamber 704 to form semiconductor devices on the wafer (step 228).

After processing several wafers, the component may need to be cleaned again. The component may be removed from the processing chamber to be cleaned using the above process.

The preconditioning step (step 204) removes particles that are generally micron-sized and larger. Such larger contaminants have been removed using conventional processes. The conditioning process comprising placing the ceramic component in a megasonic conditioning solution (step 208) and applying megasonic energy (step 212) removes submicron and nano-sized particles to a degree that is not accomplished using conventional processes. The removal of submicron and nano-sized particles allows a reduction or elimination of seasoning time Eliminating or reducing the time required to season components, allows more processing chamber time for processing wafers. In addition, more processing may be achieved between changing of components. Also, less power and other resources are required for seasoning.

Preferably, megasonic waves are defined as having a frequency of at least 800 kHz. Ultrasonic waves are defined as being no greater than 760 kHz.

The embodiment yields extremely superior cleaned ceramics such as alumina and yttria surfaces as depicted in the scanning electron micrograph images taken of the post (chemical/megasonic) cleaned poly-crystalline alumina and yttria coated surfaces. These clean results thus far have been un-matched using traditional cleaning processes. This is due to the fact that neither the manufacturing supplier nor the component cleaning supplier have been able to achieve equivalent clean results by using their traditional process of record cleaning methods. The disclosed cleaning method yields ceramic surfaces that exhibit no small sized particle contaminates ranging in size from submicron down to tens of nanometers. This observation is seen on both polished smooth bulk surfaces, micron sized grains, in between grains, and areas within even more challenging larger surface pits that exhibit rich surface morphology and topography.

Figure 8:
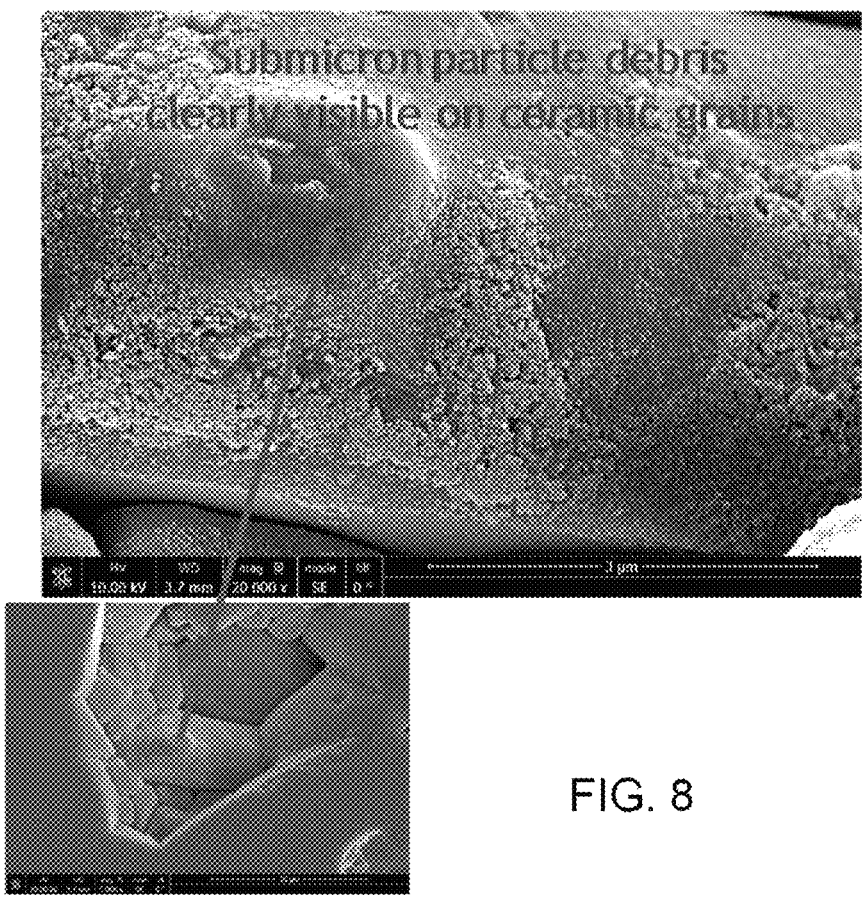
FIG. 8 shows an image and an enlarged image of an alumina surface after a clean using 40 kHz ultrasonic energy followed by a deionized water rinse.
Figure 9:
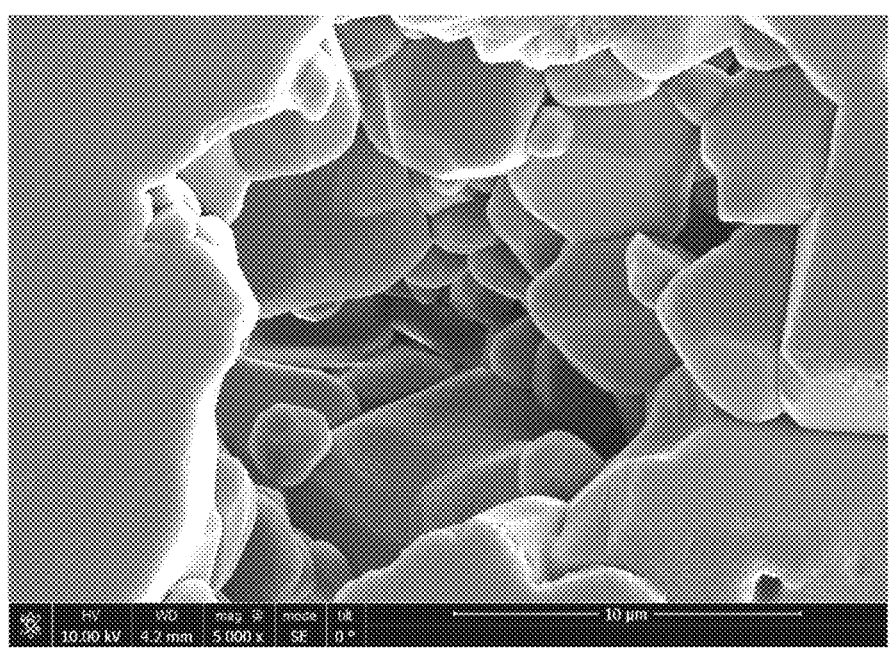
FIG. 9 shows an enlarged image of an alumina surface after being subjected to 950 kHz megasonic energy and a deionized water clean.
Figure 10A:
FIGS. 10A-B show an image and an enlarged image of an yttria surface before and after a clean using 950 kHz megasonic energy followed by a deionized water rinse.
Figure 10B:
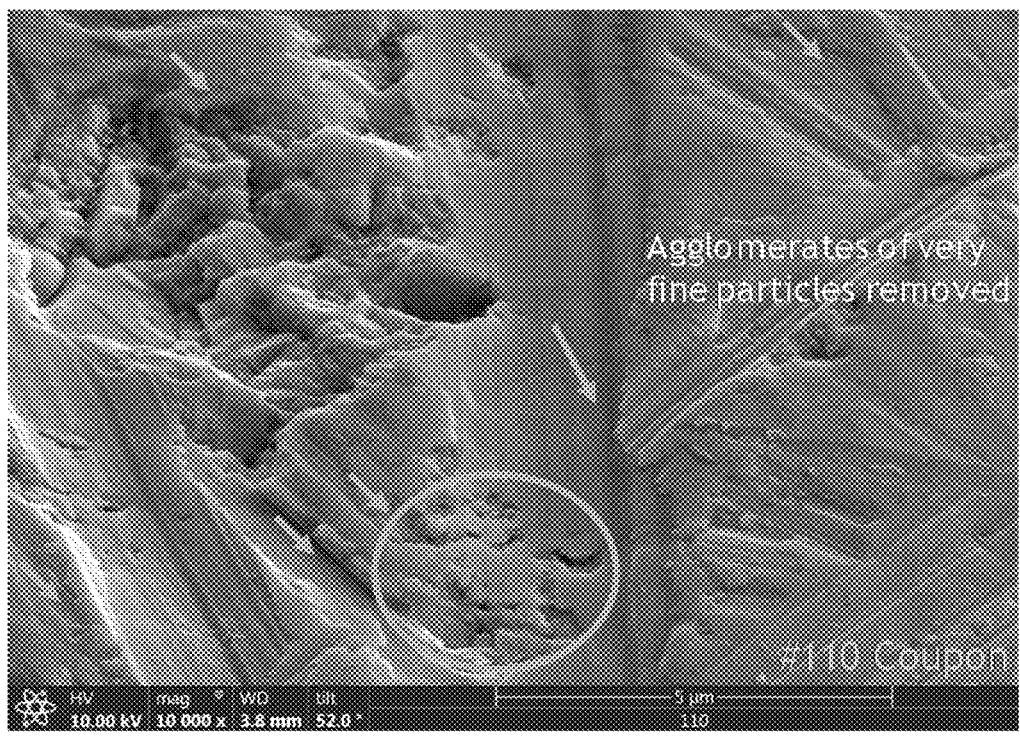

Conventional ceramic cleaning methods that typically begin using concentrated mineral acids to remove impurities, ionic or non-ionic detergents and/or solvents to remove organic contaminates, and traditional low frequency sonication are ineffective in removing small submicron to nano-sized particles. This is evidenced by looking at the electron micrographs of a non-clean alumina and yttria results after the component had been cleaned by a manufacturing supplier and/or the critical components cleaning supplier. FIG. 8 shows an image and an enlarged image of an alumina surface after a final clean using 40 kHz ultrasonic energy followed by a deionized water rinse. Submicron sized debris can be seen on the surface. FIG. 9 shows an enlarged image of an alumina surface after being subjected to 950 kHz or higher megasonic energy and a deionized water clean. The submicron debris has been removed. FIG. 10A shows an enlarged image of a yttria coated surface before being subjected to 950 kHz or higher megasonic energy. Agglomerates of very fine particles are visible on the surface topography. FIG. 10B shows an enlarged image of a yttria coated surface after being subjected to 950 kHz or higher megasonic energy and a deionized water clean. The coating has been exfoliated and submicron debris has been removed.

It is important to note that for comparable cleaning efficiencies, the power intensities that are seen in megasonic units are generally 10 to 50 times lower than those used in ultrasonic cleaners. Unlike lower frequency ultrasonics that rely on transient cavitations for cleaning, the higher frequency used in megasonics results in a higher pressure wave that is created in solution rather than bubbles. The reason for the increased efficiency using megasonics lies in the mechanism for a particle detaching from the surface. The high-pressure waves push and pull at particles that are dislodged on a surface at a rate of approximately 800,000-100,000 times/s. In this regard, megasonic cleaning offers distinct advantages over ultrasonic due to the absence of transient cavitations, which reduces the probability of material damage, mechanical stress, and the ability to use chemical solutions, such as a SC1 solution and other tailored surfactants to simultaneously aid removal of particles and organic films.

The embodiment leverages using these high frequency acoustic excitation characteristics, by applying high frequency energy to oversized components with complex geometries, along with a chemical effect to target removing submicron to nanometer sized particles from ceramic surfaces with extremely high efficiency.

In other embodiments, the scanning megasonic transducer head 144 does not extend across a dimension of the tank 108. In such embodiments, the megasonic transducer head 144 would scan or raster in two dimensions across the tank 108. In other embodiments, multiple megasonic transducer heads 144 may be used. In other embodiments, other materials instead of quartz may be used to enclose the megasonic transducers 164. Such materials must have minimal damping or reflection and optimal transmission of the megasonic energy and minimal chemical interaction with the megasonic conditioning solution 116. An example of another material for the enclosing the megasonic transducers 164 would be stainless steel wrapped with a Teflon™ based coating. In other embodiments, the tank 108 has a height that is greater than the width of the tank 108. In such an embodiment, the component might be placed on edge, so that as mounted the height of the ceramic containing component 110 is greater than the width of the ceramic containing component 110. For example, the width of the tank 108 would be less than one third the length of the tank 108, allowing for a smaller volume and a smaller resident time for the removed particulates within the megasonic conditioning solution 116.

Figure 11A:
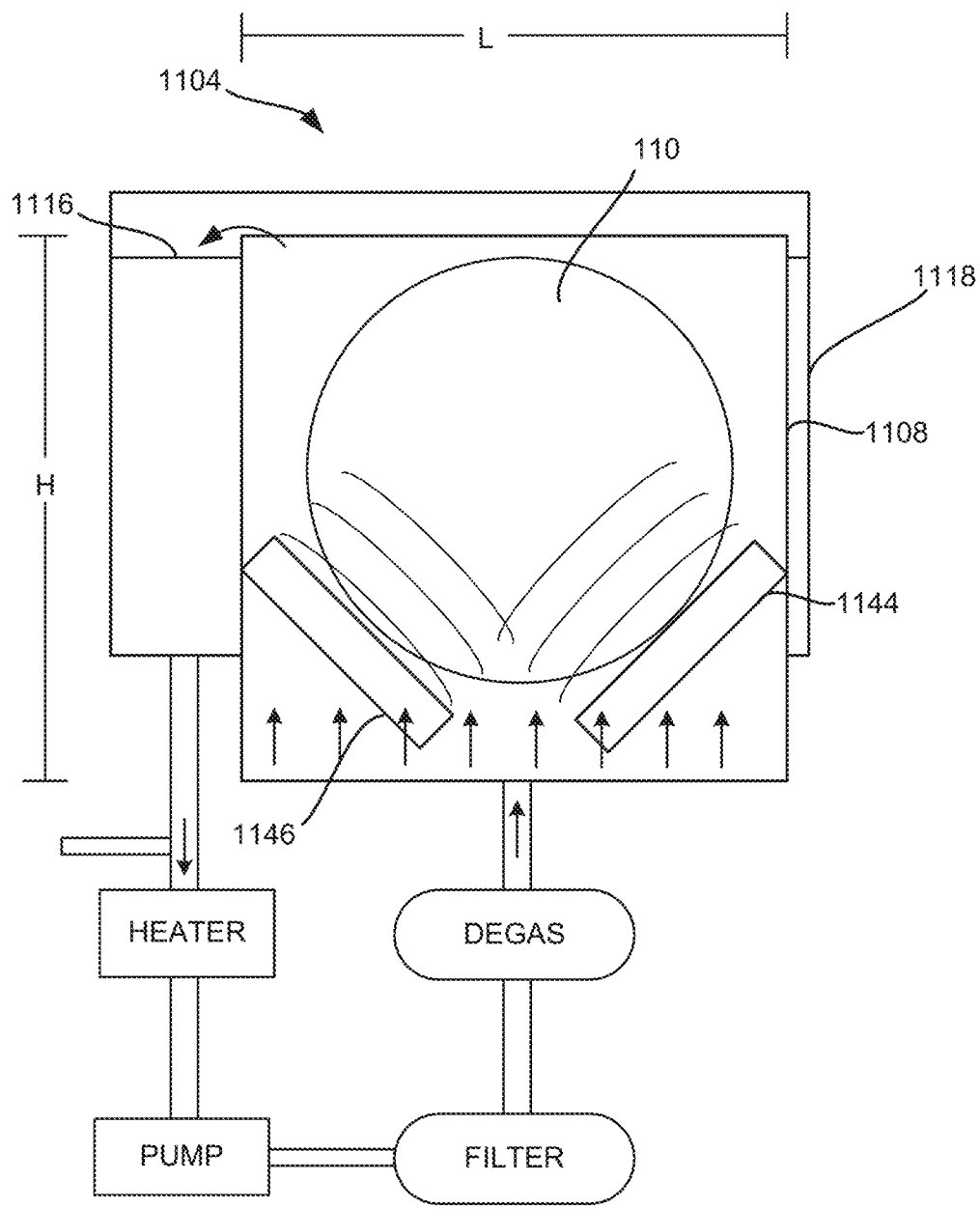
FIG. 11A-B are schematic illustrations of megasonic processing module used in another embodiment.
Figure 11B:
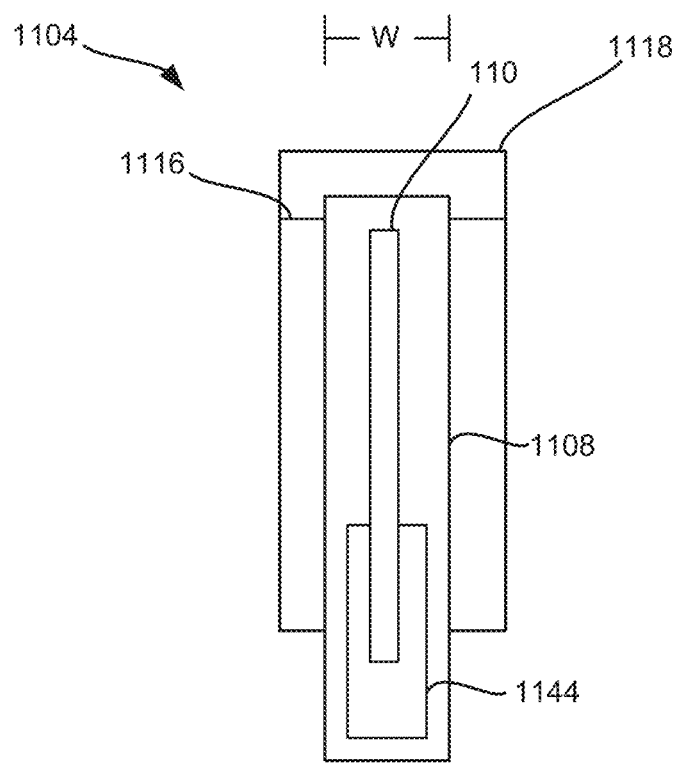

FIG. 11A is a schematic side cross-sectional view of a megasonic processing module 1104 used in another embodiment. In this embodiment, the ceramic containing component 110 is a disk shaped ceramic component, such as a power window. In this embodiment the ceramic containing component 110 is placed vertically in the megasonic processing module 1104, so that the vertical direction is parallel to the circular surface of the disk shaped ceramic containing component 110, which is the largest surface of the ceramic containing component 110. The megasonic processing module 1104 comprises a tank 1108 in which the ceramic containing component 110 is vertically mounted. A gutter 1118 is placed to catch megasonic conditioning solution 1116 that flows from the tank 1108. The megasonic processing module 1104 has a first megasonic transducer head 1144 and a second megasonic transducer head 1146. The first and second megasonic transducer heads 1144, 1146 are positioned to provide megasonic energy to at least one or both circular surfaces of the disk shaped ceramic containing component 110. The first and second megasonic transducer heads 1144, 1146 are stationary. The tank 1108 has a height H, which is greater than the diameter of the disk shaped ceramic containing component 110. The tank 1108 has a length L, which is greater than the diameter of the disk shaped ceramic containing component 110. FIG. 11B is a schematic illustration of a cross-sectional side view of the tank 1108, shown in FIG. 11A. The tank 1108 has a width W which is greater than thickness of the disk shaped ceramic containing component 110. Since the disk shaped ceramic containing component 110 has a thickness that is many times less than the diameter of the disk shaped ceramic containing component 110, the tank 1108 has a width W that is a fraction of the height H and length L of the tank 1108. In this example, the width W of the tank 1108 is less than one fifth the length L and height H of the tank 1108. So, in this example the length L and height H of the tank 1108 are at least five times the width W of the tank 1108.

The vertical mounting allows for a thinner tank 1108. The thinner tank 1108 would have a reduced footprint. The thinner tank 1108 may allow a shorter resident time for the passing of the megasonic conditioning solution 1116 in the tank 1108. The thinner tank 1108 may also result in higher purity fluids and gas controls and lower particle levels.

In some embodiments, instead of flowing the megasonic conditioning solution 1116 back into the tank again, the megasonic conditioning solution is provided in a single pass, before being disposed. Such embodiments may not need to filter the megasonic conditioning solution. Various embodiments allow over-sized components with complex geometries to be megasonically cleaned. In various embodiments, plasma wafer processing chamber ceramic containing components, such as dielectric power windows, gas injectors, edge rings, electrodes, showerheads, high flow liners, and electrostatic chucks, may be conditioned.

In various embodiments the megasonic conditioning solution 116 may be a surfactant solution with anionic, cationic, or nonionic chemical surfactants species and surface tension reducing chemical reagent additives. In various embodiments, the megasonic conditioning solution 116 may be acidic, basic, or neutral pH chemical reagents.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for conditioning a component of a wafer processing chamber, comprising:
    placing the component in an ultrasonic conditioning solution in an ultrasonic solution tank;
    applying ultrasonic energy through the ultrasonic conditioning solution from a megasonic transducer head to the component to clean the component;
    submerging the component in a megasonic conditioning solution in a tank, wherein the submerging the component in the megasonic conditioning solution comprises mounting the component on a mount in the tank;
    applying megasonic energy through the megasonic conditioning solution to the component to clean the component; and
    flowing the megasonic conditioning solution during the applying megasonic energy; comprising:
        flowing the megasonic conditioning solution into the tank at a location below where the component is mounted in the tank, through at least one inlet; and
        draining the megasonic conditioning solution from the tank at a location above where the component is mounted in the tank,
        wherein at least part of the inlet is under where the component is mounted in the tank;
        on a mount in the tank,
        wherein the megasonic transducer head is above the component and faces the inlet, wherein the component is between the inlet and the transducer head.

2. The method, as recited in claim 1, further comprising providing a blasting of the component to clean the component, before placing the component in the ultrasonic conditioning solution.

3. The method, as recited in claim 2, wherein the blasting comprises blasting the component with solid $CO_2$.

4. The method, as recited in claim 2, further comprising polishing the component before providing the blasting.

5. The method, as recited in claim 4, further comprising scrubbing the component before providing the blasting.

6. The method, as recited in claim 1, wherein the applying the megasonic energy uses a scanning megasonic head.

7. The method, as recited in claim 6, wherein the scanning megasonic head comprises:
    at least one megasonic transducer; and
    a quartz housing enclosing the at least one megasonic transducer, wherein the at least one megasonic transducer applies megasonic energy to the megasonic conditioning solution through the quartz housing.

8. The method, as recited in claim 1, further comprising flowing the megasonic conditioning solution during the applying megasonic energy.

9. The method, as recited in claim 8, wherein the flowing the megasonic conditioning solution, comprises
    recirculating the megasonic conditioning solution in the tank, comprising:
        flowing the megasonic conditioning solution into the tank;
        draining the megasonic conditioning solution from the tank; and
        flowing the megasonic conditioning solution back into the tank; and
    passing the megasonic conditioning solution through at least one filter after draining the megasonic conditioning solution and before flowing the megasonic conditioning solution back into the tank.

10. The method, as recited in claim 8, wherein the flowing the megasonic conditioning solution provides a single pass of the megasonic conditioning solution.

11. The method, as recited in claim 1, wherein the component is a ceramic containing component.

* * * * *